US011108212B2

(12) United States Patent
Xie et al.

(10) Patent No.: US 11,108,212 B2
(45) Date of Patent: Aug. 31, 2021

(54) OPTICAL INTERFERENCE LIGHT SOURCE DEVICE OF CURRENT-TEMPERATURE CONTROLLED SEMICONDUCTOR LASER AND MEASUREMENT SYSTEM INCLUDING THE SAME

(71) Applicant: GUANGDONG UNIVERSITY OF TECHNOLOGY, Guangzhou (CN)

(72) Inventors: Shengli Xie, Guangzhou (CN); Kan Xie, Guangzhou (CN); Yanzhou Zhou, Guangzhou (CN); Haochuan Zhang, Guangzhou (CN)

(73) Assignee: Guangdong University of Technology, Guangzhou (CN)

( * ) Notice: Subject to any disclaimer, the term of this patent is extended or adjusted under 35 U.S.C. 154(b) by 48 days.

(21) Appl. No.: 16/833,157

(22) Filed: Mar. 27, 2020

(65) Prior Publication Data
US 2020/0313388 A1    Oct. 1, 2020

(51) Int. Cl.
*H01S 3/13*    (2006.01)
*H01S 5/068*    (2006.01)
(Continued)

(52) U.S. Cl.
CPC .......... *H01S 5/06804* (2013.01); *H01S 5/02* (2013.01); *H01S 5/02461* (2013.01);
(Continued)

(58) Field of Classification Search
CPC ............ H01S 5/02476; H01S 5/02461; H01S 5/0207; H01S 5/02; H01S 5/06804; H01S 5/02469
See application file for complete search history.

(56) References Cited

U.S. PATENT DOCUMENTS

2003/0174753 A1* 9/2003 Yabuki ............... H01S 5/4031
372/50.12
2014/0112363 A1* 4/2014 Feitisch .............. H01S 5/02365
372/43.01
(Continued)

FOREIGN PATENT DOCUMENTS

CN    2020308772 U    7/2012
CN    103633553 A    3/2014
(Continued)

OTHER PUBLICATIONS

Office Action dated May 28, 2020 for Chinese Patent Application No. 201910243857.9.
(Continued)

*Primary Examiner* — Kinam Park
(74) *Attorney, Agent, or Firm* — Suiter Swantz pc llo

(57) ABSTRACT

Provided is an optical interference light source device of a current-temperature controlled semiconductor laser, including a heat dissipation plate, a ring-shaped semiconductor refrigerating sheet, a semiconductor laser, a PCB board, a thermal sensor and a fixed plate. The first circular window copper area of the PCB is in contact with the second circular copper area through a via. A lower end of a housing of the semiconductor laser is connected to the first circular windowed copper area through a thermally conductive silicone grease. The ring-shaped semiconductor refrigerating sheet is connected to the first circular window copper area through a thermally conductive silicone grease connected to the heat dissipation plate. The thermal sensor is configured to detect a temperature of the first circular windowed copper area. The present disclosure has beneficial effects of simple structures, good thermal conductivities, high temperature control precisions, and stable output wavelengths of the laser.

12 Claims, 4 Drawing Sheets

(51) Int. Cl.
  *H01S 5/024* (2006.01)
  *H01S 5/02* (2006.01)
(52) U.S. Cl.
  CPC ........ *H01S 5/02476* (2013.01); *H01S 5/0207* (2013.01); *H01S 5/02469* (2013.01)

(56) References Cited

U.S. PATENT DOCUMENTS

2018/0235040 A1* 8/2018 Yamanaka .............. H01S 5/024
2019/0067161 A1* 2/2019 Kaifuchi ............... H01S 5/0235

FOREIGN PATENT DOCUMENTS

| CN | 203481619 U | 3/2014 |
| CN | 203553611 U | 4/2014 |
| CN | 105890538 A | 8/2016 |
| CN | 105896308 A | 8/2016 |
| CN | 207353421 U | 5/2018 |

OTHER PUBLICATIONS

Search Report dated May 28, 2020 for Chinese Patent Application No. 201910243857.9.

* cited by examiner

OPTICAL INTERFERENCE LIGHT SOURCE DEVICE OF CURRENT-TEMPERATURE CONTROLLED SEMICONDUCTOR LASER AND MEASUREMENT SYSTEM INCLUDING THE SAME

CROSS-REFERENCE TO RELATED APPLICATIONS

The present application claims priority to Chinese Patent Application No. 201910243857.9, filed on Mar. 28 2019, the content of which is incorporated herein by reference in its entirety.

TECHNICAL FIELD

The present disclosure relates to an optical interference light source device and a measurement system including the same, and particularly, to an optical interference light source device of a current-temperature controlled semiconductor laser and a laser wavenumber scanning interferometry system including the same.

BACKGROUND

A semiconductor laser is also named a diode laser (LD). Compared with traditional lamp pumped lasers, the semiconductor laser has many advantages such as small size, high efficiency, light weight, long service life, good coherence, etc. The semiconductor laser has been widely used in fields of optical measurement, laser communication, optical storage, laser printing, radar and the like, and it is one of the most widely used optoelectronic elements.

Since the semiconductor laser has significant temperature characteristics, it is a temperature-sensitive element, and its optical power and output wavelength vary greatly with temperature. An operating principle of the semiconductor laser determines that it will inevitably generate heat when it is operating, but the heat generated by itself seriously affects output characteristics of the LD (e.g., drift of the output wavelength of the LD with temperature). However, in some optical measurement occasions, an operating temperature of the semiconductor laser must be controlled with high precision, and then the wavelength of the semiconductor laser is tuned to improve the measurement precision. There are usually two methods:

Method 1: stabilizing the operating temperature of the semiconductor laser with other factors being unchanged, while changing an operating current of the semiconductor laser to stably change the wavelength.

Method 2: stabilizing the operating current of the semiconductor laser with other factors being unchanged, while changing the operating temperature of the semiconductor laser to stably change the wavelength.

However, the currently available semiconductor lasers in the market can rarely change the wavelength steadily by the method 1 since it requires very high performance of the semiconductor laser itself, whereas the method 2, in which the wavelength is changed stably by changing an ambient temperature of the laser, is more easily achieved, so that whether the ambient temperature of the semiconductor laser can be controlled precisely is very important. A traditional temperature-controlled method is to use a heat sink to control the temperature of the semiconductor laser, and the heat generated from the semiconductor laser sequentially passes through a welding layer, an insulation layer and the heat sink and is finally dissipated through convection heat transfer. However, since the semiconductor laser and the heat sink always have an insulated position and heat conduction inertia of the heat sink is large, a heat transfer efficiency is low, and an effect is poor. As a result, the operating temperature of the semiconductor laser cannot be accurately and quickly controlled, which in turn results in occurring of unstable factors (such as occurrence of mode jumps) when tuning the wavenumber.

SUMMARY

In view of the above problems, an object of the present disclosure is to provide an optical interference light source device of a current-temperature controlled semiconductor laser, which has simple structures, good thermal conductivities, high temperature control precisions and stable output wavelengths of a laser, and a laser wavenumber scanning interferometry system including the optical interference light source device.

The object of the present disclosure can be achieved by using following technical aspects.

In an aspect of the present disclosure, an optical interference light source device of a current-temperature controlled semiconductor laser is provided, which includes a heat dissipation plate, a ring-shaped semiconductor refrigerating sheet, a semiconductor laser, a PCB board, a thermal sensor and a fixed plate; a first circular windowed copper area and a second circular copper area are provided at centers of two surfaces of the PCB board, respectively, and the first circular windowed copper area is in contact with the second circular copper area through a via; the semiconductor laser is electrically connected to a center of the PCB board, and a lower end of a housing of the semiconductor laser is connected to the first circular windowed copper area through a thermally conductive silicone grease; the ring-shaped semiconductor refrigerating sheet is provided with a through hole at a center thereof, a refrigerating surface of the ring-shaped semiconductor refrigerating sheet is connected to the first circular windowed copper area through the thermally conductive silicone grease, the semiconductor laser is sleeved at a center of the through hole, and a heating surface of the ring-shaped semiconductor refrigerating sheet is connected to the heat dissipation plate through the thermally conductive silicone grease; the heat dissipation plate is provided with a laser output hole, a center line of the through hole coincides with a center line of the laser output hole, and light emitted by the semiconductor laser coincides with the center line of the laser output hole; the PCB board is fixedly installed on the fixed plate, and the second circular copper area is in contact with the fixed plate; and the thermal sensor is provided on the first circular windowed copper area to detect a temperature of the first circular windowed copper area.

In an implementation, the heat dissipation plate, the PCB board, and the fixed plate are each provided with a plurality of mounting holes, and the laser output hole is provided at a center position of a polygon defined by the plurality of the mounting holes; and each of the plurality of mounting holes is provided with a connecting member to fixedly connect the heat dissipation plate, the PCB board and the fixed plate together.

In an implementation, the heat dissipation plate is made of aluminum.

In an implementation, the thermal sensor is a Negative Temperature Coefficient (NTC) thermistor.

In an aspect of the present disclosure, a laser wavenumber scanning interferometry system is provided, which includes the optical interference light source device according to the above aspect, a beam splitter configured to divide coherent light into two parts; a measured lens; an optical wedge; a CCD camera configured to capture an interference image; a computer configured to process image information; a controller configured to adjust an operating temperature and an operating current of the semiconductor laser; and a bilateral telecentric lens for improving measurement precision. The optical interference light source device, the bilateral telecentric lens, the optical wedge, and the measured lens are sequentially arranged in a counterclockwise direction, and the beam splitter is located at a center position; the coherent light is emitted from the optical interference light source device, and reaches the optical wedge through the beam splitter, to form a first incident light path; the coherent light is reflected at the optical wedge and reaches the bilateral telecentric lens through the beam splitter, to form a first reflected light path; the coherent light is emitted from the optical interference light source device, and reaches the measured lens through the beam splitter, to form a second incident light path; the coherent light is reflected at the measured lens, and reaches the bilateral telecentric lens through the beam splitter, to form a second reflected light path; the first reflected light path and the second reflected light path form an interference image after passing through the bilateral telecentric lens; and the CCD camera is further configured to sample the interference image to obtain an interference signal and send the interference signal to the computer.

In an implementation, the interference signal sampled and obtained by the CCD camera is a discrete interference signal, and the computer is configured to perform a Fourier transform on the interference signal to obtain an amplitude-frequency characteristic and a phase-frequency characteristic, obtain an interference phase and an interference frequency at a peak, then demodulate the interference phase and the interference frequency to obtain depth contour information of a measured surface, and then obtain a 3D model map of a measured object by fitting.

Implementation of the present disclosure has following beneficial effects:

1. The present disclosure can control heating and cooling of the first circular windowed copper area on the PCB board by controlling directions of currents at two ends of the ring-shaped semiconductor refrigerating sheet, while a heating capacity and a cooling capacity of the first circular windowed copper area on the PCB board can be controlled by controlling magnitudes of the currents at the two ends of the ring-shaped semiconductor refrigerating sheet, so as to change the temperature on the first copper area of the PCB board. The NTC thermistor measures and obtains a real-time operating temperature of the semiconductor laser by measuring the temperature of the first circular windowed copper area on the PCB board, to realize adjustment and measurement of the operating temperature of the semiconductor laser, and it has advantages of simple structure and convenient detection and control.

2. In the present disclosure, the ring-shaped semiconductor refrigerating sheet is in direct contact with the first circular windowed copper on the PCB board, which improves a refrigerating effect. Furthermore, in the present disclosure, the housing of the semiconductor laser is welded to the first circular windowed copper area of the PCB board, so that heat used by the semiconductor laser is heat-transferred through the first circular windowed copper area and the second circular copper area on the PCB board, which replaces a pure copper heat sink that is of traditional thermal conduction and accelerates the heat conduction of the semiconductor laser, thereby improving the temperature control precision and increasing the temperature control range and thus improving the stability of the output wavelength of the semiconductor laser. This can prevent occurring of mode jumps and solve problems existing in the traditional temperature control method, in which the heat sink is used to control the temperature of the semiconductor laser and the heat generated from the semiconductor laser sequentially passes through a welding layer, an insulation layer, and the heat sink and is finally dispersed by thermal convection, resulting in a low heat transfer efficiency and a poor effect so that it cannot guarantee precise control of the operating temperature of the semiconductor laser and thus problems of instability factors are caused when tuning the wavenumber. The present disclosure has the advantages of simple structures, good thermal conductivities, high temperature control precisions, and stable output wavelengths of the laser.

BRIEF DESCRIPTION OF DRAWINGS

In order to more clearly explain the embodiments of the present disclosure or the technical solutions in the related art, drawings used in the description of the embodiments or the related art will be briefly introduced below. Obviously, the drawings in the following description are merely some embodiments of the present disclosure. For those of ordinary skill in the art, other drawings can be obtained based on these drawings without making creative efforts.

DESCRIPTION OF EMBODIMENTS

The technical solutions in the embodiments of the present disclosure will be clearly and completely described below with reference to the drawings in the embodiments of the present disclosure. Obviously, the described embodiments are only a part of the embodiments of the present disclosure but not all of the embodiments. Based on the embodiments of the present disclosure, all other embodiments obtained by a person of ordinary skill in the art without creative efforts shall fall within the protection scope of the present disclosure.

Embodiments

Figure 1:
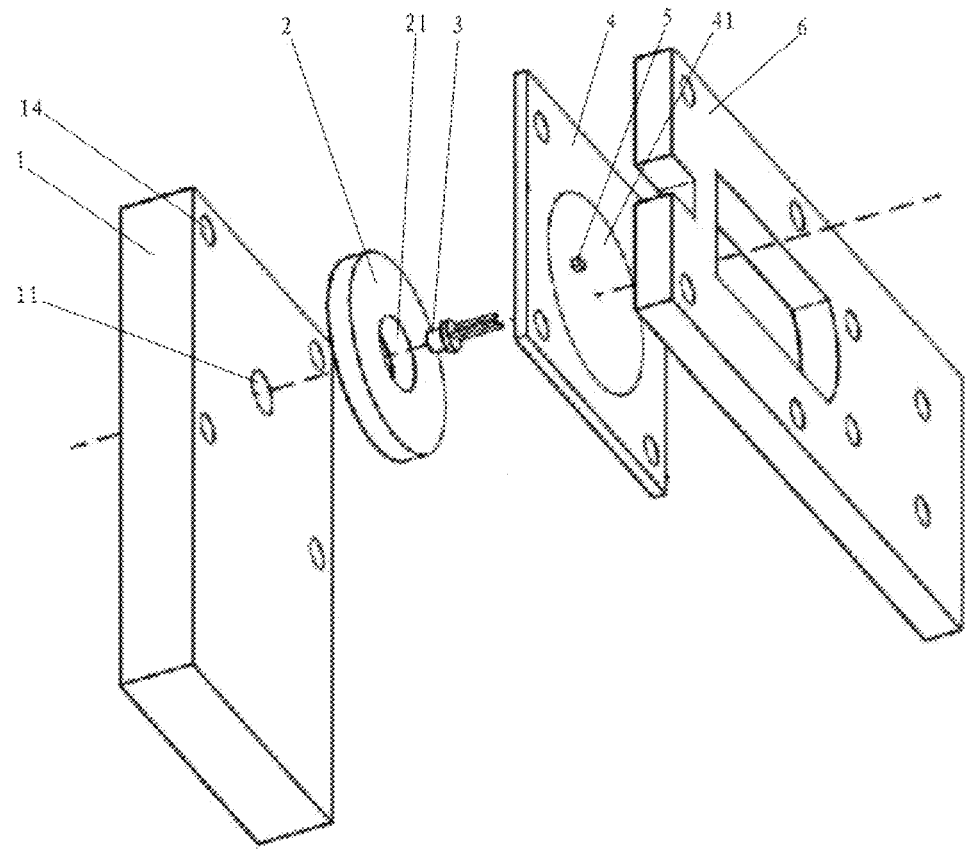
FIG. 1 is a structural schematic diagram of an optical interference light source device of a current-temperature controlled semiconductor laser according to the present disclosure.

Referring to FIG. 1, the present embodiment relates to an optical interference light source device of a current-temperature controlled semiconductor laser. The optical interference light source device includes a heat dissipation plate 1, a ring-shaped semiconductor refrigerating sheet 2, a semiconductor laser 3, a PCB board 4, a thermal sensor 5 and a fixed plate 6. A first circular windowed copper area and a second circular copper area 41 are provided at centers of two surfaces of the PCB board 4, respectively, and the first circular windowed copper area is in contact with the second circular copper area 41 through a via. The semiconductor laser 3 is electrically connected to the center of the PCB board 4, and a lower end of a housing of the semiconductor laser 3 is connected to the first circular windowed copper area through a thermally conductive silicone grease. The ring-shaped semiconductor refrigerating sheet 2 is provided with a through hole 21 at its center, a refrigerating surface of the ring-shaped semiconductor refrigerating sheet 2 is connected to the first circular windowed copper area through the thermally conductive silicone grease, and the semiconductor laser 3 is sleeved at a center of the through hole 21. A heating surface of the ring-shaped semiconductor refrigerating sheet 2 is connected to the heat dissipation plate 1 by the thermally conductive silicone grease, the heat dissipation plate 1 is provided with a laser output hole 11, a center line of the through hole 21 coincides with a center line of the laser output hole 11, and light emitted by the semiconductor laser 3 coincides with the center line of the laser output hole 11. The PCB board 4 is fixedly installed on the fixed plate 6, and the second circular copper area 41 is in contact with the fixed plate 6. The thermal sensor 5 is provided on the first circular windowed copper area to detect a temperature of the first circular windowed copper area. The thermal sensor 5 can be an NTC thermistor.

The present disclosure can control heating and cooling of the first circular windowed copper area on the PCB board 4 by controlling directions of currents at two ends of the ring-shaped semiconductor refrigerating sheet 2, while a heating capacity and a cooling capacity of the first circular windowed copper area on the PCB board 4 can be controlled by controlling magnitudes of the currents at the two ends of the ring-shaped semiconductor refrigerating sheet 2, so as to change the temperature of the first copper area of the PCB board 4. The NTC thermistor measures and obtains a real-time operating temperature of the semiconductor laser 3 by measuring the temperature of the first circular windowed copper area on the PCB board 4, to achieve adjustment and measurement of the operating temperature of the semiconductor laser 3, and it has advantages of simple structure and convenient detection and control.

The first circular windowed copper area is a PCB board, on which copper is coated and then a solder resist layer is removed therefrom, and it has the better thermal performance. The lower end of the housing of the semiconductor laser 3 according to the present disclosure corresponds to a shape of the first circular windowed copper area, so that a temperature field of the semiconductor laser 3 is evenly distributed on the first circular windowed copper area, which improves a heat conduction efficiency of the semiconductor laser 3, and thus improves a temperature control precision and a response speed of the semiconductor laser 3 while greatly improving modal stability of a wavelength output by the semiconductor laser 3. In addition, in the present disclosure, the housing of the semiconductor laser 3 is welded to the first circular windowed copper area of the PCB board 4, so that heat used by the semiconductor laser 3 is heat-transferred through the first circular windowed copper area and the second circular copper area 41 on the PCB board 4, which replaces a pure copper heat sink of the traditional thermal conduction and accelerates the heat conduction of the semiconductor laser 3, thereby improving the temperature control precision and increasing the temperature control range and thus improving the stability of the output wavelength of the semiconductor laser 3. This can prevent occurring of mode jumps and solve problems existing in the traditional temperature control method, in which the heat sink is used to control the temperature of the semiconductor laser 3 and the heat generated from the semiconductor laser 3 sequentially passes through a welding layer, an insulation layer and the heat sink and is finally dispersed by thermal convection, resulting in a low heat transfer efficiency and a poor effect so that it cannot guarantee precise control of the operating temperature of the semiconductor laser 3 and thus problems of instability factors are caused when tuning the wavenumber. The present disclosure has the advantages of simple structures, good thermal conductivities, high temperature control precisions, and stable output wavelengths of the laser.

The heat dissipation plate 1, the PCB board 4, and the fixed plate 6 are each provided with a plurality of mounting holes 14, and the laser output hole 11 is provided at a center position of a polygon defined by the plurality of the mounting holes 14. The mounting hole 14 is provided with a connecting member to fixedly connect the heat dissipation plate 1, the PCB board 4 and the fixed plate 6 together.

In order to provide the thermal conduction efficiency of the heat dissipation plate 1, the heat dissipation plate 1 can be made of aluminum.

Figure 5:
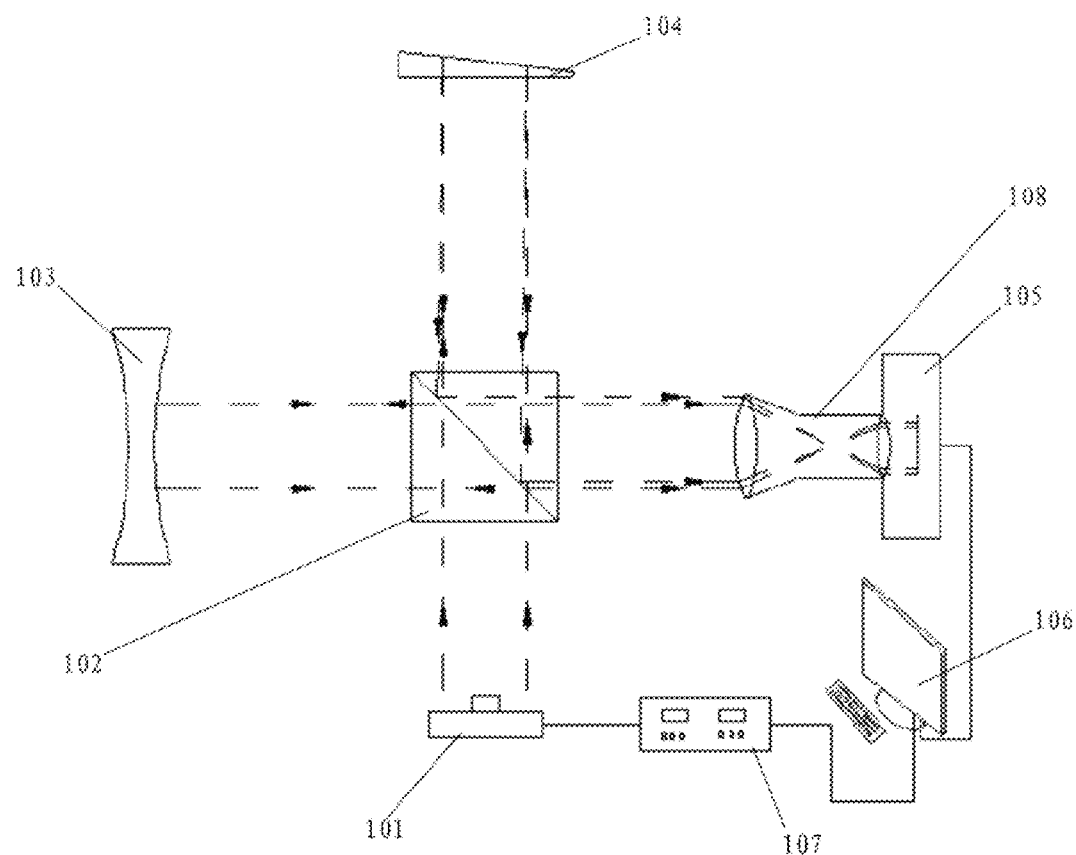
FIG. 5 is a structural schematic diagram of a laser wavenumber scanning interferometry system of an optical interference light source device of a current-temperature controlled semiconductor laser according to the present disclosure.

The present embodiment further provides a laser wavenumber scanning interferometry system of an optical interference light source device of a current-temperature controlled semiconductor laser. As shown in FIG. 5, the laser wavenumber scanning interferometry system includes an optical interference light source device 101, a beam splitter 102 for dividing coherent light into two parts, a measured lens 103, an optical wedge 104, a CCD camera 105 for capturing an interference image, a computer 106 for processing image information, a controller 107 for adjusting the operating temperature and the current of the semiconductor laser 3, and a Bilateral Telecentric Lens 108 for precision inspection.

Figure 6:
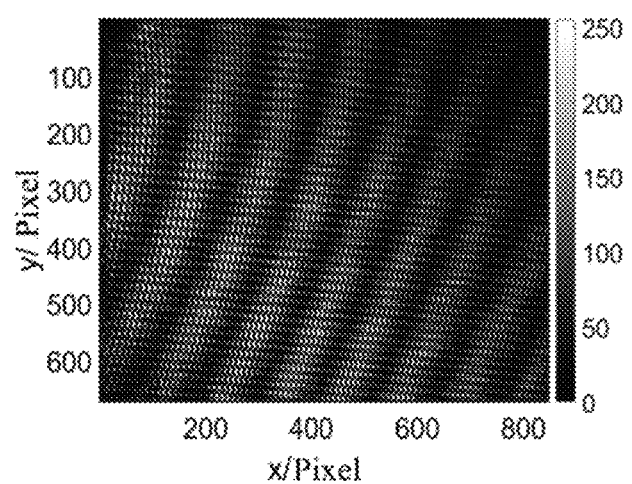
FIG. 6 is a diagram illustrating an interference image formed in a bilateral telecentric lens.

The optical interference light source device 101, the bilateral telecentric lens 108, the optical wedge 104, and the measured lens 103 are sequentially arranged in a counter-clockwise direction, and the beam splitter 102 is located at a center position. The coherent light is emitted from the optical interference light source device 101, and reaches the optical wedge 104 through the beam splitter 102, to form a first incident light path. The coherent light is reflected at the optical wedge 104 and reaches the bilateral telecentric lens 108 through the beam splitter 102, to form a first reflected light path. The coherent light is emitted from the optical interference light source device 101, and reaches the measured lens 103 through the beam splitter 102, to form a second incident light path. The coherent light is reflected at the measured lens 103, and reaches the bilateral telecentric lens 108 through the beam splitter 102, to form a second reflected light path. The first reflected light path and the second reflected light path form an interference image after passing through the bilateral telecentric lens 108, as shown in FIG. 6. The CCD camera 105 is configured to sample the interference image to obtain an interference signal and send the interference signal to the computer 106.

Figure 7:
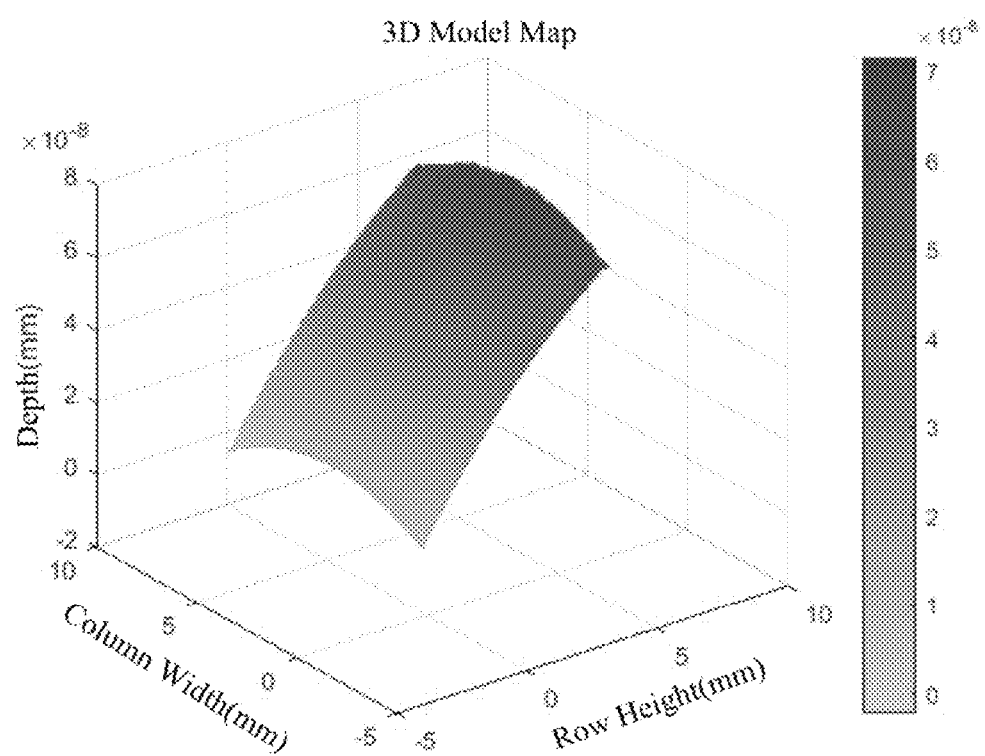
FIG. 7 is a diagram illustrating a fitted 3D model of a measured object.

The interference signal sampled and obtained by the CCD camera 105 is a discrete interference signal, and the computer 106 performs a Fourier transform on the interference signal to obtain an amplitude-frequency characteristic and a phase-frequency characteristic. An interference phase and an interference frequency can be obtained at a peak. Then, the interference phase and the interference frequency are demodulated to obtain depth contour information of the measured surface, and then a 3D model map of the measured object is obtained by fitting, as shown in FIG. 7.

There are two important index parameters in laser wavenumber scanning interference detection: (1) a contour resolution in a depth z-direction (a depth contour resolution for short), which refers to a minimum optical distance difference between two surfaces of a measured object that can be distinguished by the laser wavenumber scanning interferometry system; and (2) a depth contour range, which refers to a maximum optical distance difference that can be detected by the laser wavenumber scanning measurement system.

The depth contour resolution of the laser wavenumber scanning interference depends on a scanning range of the laser wavenumber. To increase the scanning range of the laser wavenumber, it is needed to control the semiconductor laser 3 to operate in a region having a relatively large temperature change without any mode jump. In the present disclosure, the housing of the semiconductor laser 3 is welded to the first circular windowed copper area of the PCB board 4, so that heat used by the semiconductor laser 3 is heat-transferred through the first circular windowed copper area and the second circular copper area 41 on the PCB board 4, which replaces the pure copper heat sink of the traditional thermal conduction and accelerates the heat conduction of the semiconductor laser 3, thereby improving the temperature control precision and increasing the temperature control range and thus improving the stability of the output wavelength of the semiconductor laser 3. This can increase a temperature controlled region in which there is no mode jump, so as to finally increase the scanning range of the semiconductor laser wavenumber, thereby improving the depth contour resolution and solving the problems existing in the traditional temperature control method, in which the heat sink is used to control the temperature of the semiconductor laser 3 and the heat generated from the semiconductor laser 3 sequentially passes through the welding layer, the insulation layer and the heat sink and is finally dispersed by thermal convection, resulting in a low heat transfer efficiency and a poor effect so that it cannot guarantee precise control of the operating temperature of the semiconductor laser 3 and thus problems of instability factors are caused when tuning the wavenumber. The present disclosure has the advantages of simple structures, good thermal conductivities, high temperature control precisions, and stable output wavelengths of the laser.

The manufacturing steps of the optical interference light source of the current-temperature controlled semiconductor laser of the present embodiment will be described as follows.

At Step 1, firstly, the heating surface of the ring-shaped semiconductor refrigerating sheet 2 is bonded on the heat dissipation plate 1 by using the thermally conductive silicon grease.

At Step 2, the thermal conductive silicone grease is evenly coated on a contact surface of the housing of the semiconductor laser 3 and the PCB board 4, and then three pins of the semiconductor laser 3 are welded to the PCB board 4.

At Step 3, the housing of the semiconductor laser 3 is welded to the PCB board 4 after the semiconductor laser 3 is cooled.

At Step 4, the NTC thermistor is welded to the PCB board 4 after the semiconductor laser 3 is cooled.

At Step 5, the refrigerating surface of the ring-shaped semiconductor refrigerating sheet 2 is fully bonded with the first circular windowed copper area of the PCB board 4 by using the thermally conductive silicone grease.

Before implementing the Step 1, it is necessary to ensure that the center line of the laser output hole 11 on the heat dissipation plate 1 coincides with the center line of the through hole 21 of the ring-shaped semiconductor refrigerating sheet 2.

Before implementing the Step 2, it is necessary to ensure that the output light of the semiconductor laser 3 is perpendicular to the PCB board 4, and then mounting pins of the semiconductor laser 3 and positive and negative electrodes of the semiconductor laser 3 are sequentially welded.

When performing the Step 3, it is ensured that the housing of the semiconductor laser 3 is in uniform contact with the first circular windowed copper area of the PCB board 4.

Lead wires of the ring-shaped semiconductor refrigerating sheet 2, the semiconductor laser 3, and the NTC thermistor are all welded to the PCB board 4 and then directly connected to the controller 107 by using two 4-wire PVN power wires. A temperature value is obtained by measuring based on the NTC thermistor. The controller 107 controls the operating current of the ring-shaped semiconductor refrigerating sheet 2 and its direction, and finally the control of the operating temperature of the semiconductor laser 3 is achieved. Parameters of the components used here are as follows:

(1) the semiconductor laser 3 being HL63603TG having a wavelength of 638 nm and a maximum power of 120 mW;

(2) a resistance value of the NTC thermistor being R=10 kΩ at B=3934 and a precision of 1%;

(3) the ring-shaped semiconductor refrigerating sheet 2 being TES1-04930 having a standard voltage of standard 5V and a standard current of 3 A; and (4) a model of the controller 107 being LDC-3724C.

Figure 2:
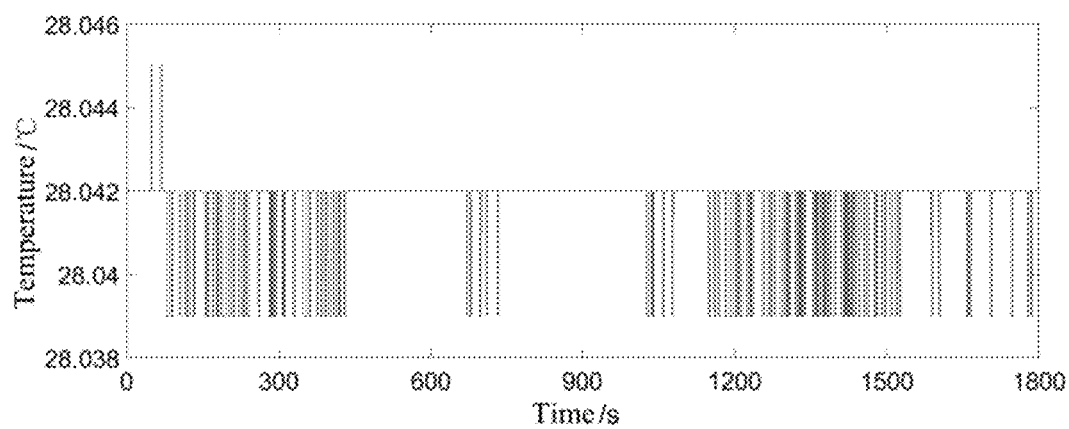
FIG. 2 is diagram illustrating a test of time-temperature change of an optical interference light source of a current-temperature controlled semiconductor laser at 28.042° C.
Figure 3:
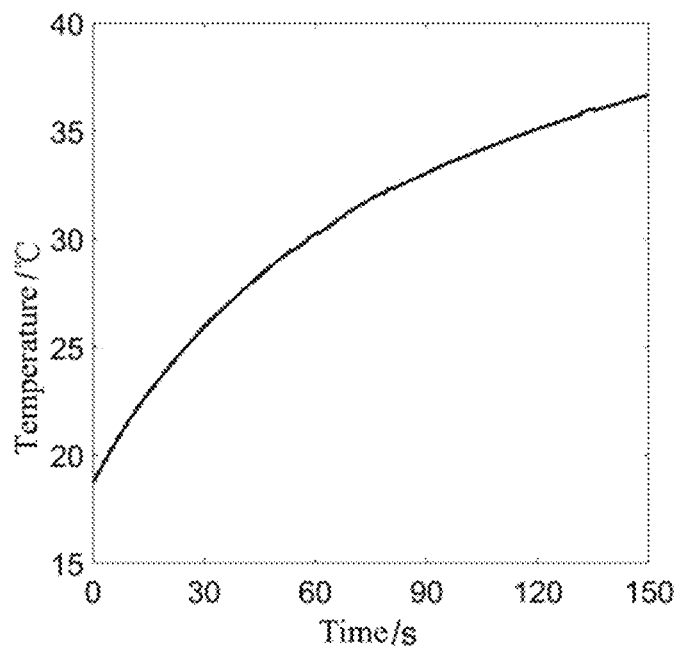
FIG. 3 is a diagram illustrating an experimental test of a change curve of an operating temperature of a semiconductor laser from 18° C. to 38° C. when a temperature-controlled current is 400 mA.
Figure 4:
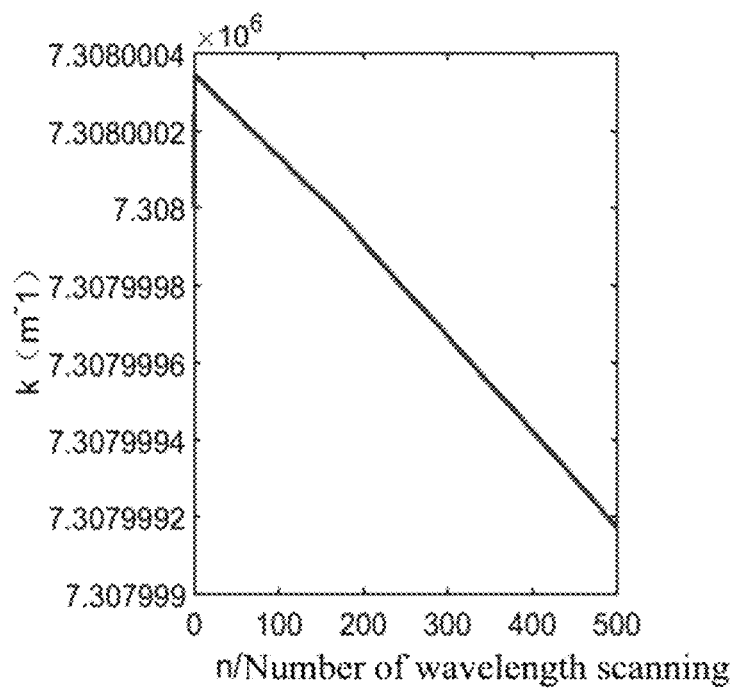
FIG. 4 is a diagram illustrating an experimental test of a linear change curve of an output wavenumber of a semiconductor laser during a period in which an operating temperature of a semiconductor laser changes from 38° C. to 18° C. when a temperature-controlled current is 400 mA.

FIG. 2 illustrates a test of the temperature stability of the optical interference light source of the current-temperature controlled semiconductor laser at 28.042° C., which proves that the interference light source has a high temperature control precision, and a specific error can be accurate to ±0.003° C. FIG. 3 illustrates an experimental test of a change curve of the operating temperature of the semiconductor laser from 18° C. to 38° C. when the temperature-controlled current is 400 mA, which proves that a change rate of the temperature of the interference light source is large. FIG. 4 illustrates an experimental test in which the output wavenumber of the semiconductor laser linearly changes as the operating temperature of the semiconductor laser changes from 38° C. to 18° C. when the temperature-controlled current is 400 mA, which indirectly proves that the interference light source has a high temperature control precision.

What has been disclosed above are only preferred embodiments of the present disclosure, and without of doubt, the scope of rights of the present disclosure cannot be limited by this. Therefore, equivalent changes made according to the claims of the present disclosure still fall within the scope of the present disclosure.

What is claimed is:

1. An optical interference light source device of a current-temperature controlled semiconductor laser, comprising a heat dissipation plate, a ring-shaped semiconductor refrigerating sheet, a semiconductor laser, a PCB board, a thermal sensor and a fixed plate,
wherein a first circular windowed copper area and a second circular copper area are provided at centers of two surfaces of the PCB board, respectively, and the first circular windowed copper area is in contact with the second circular copper area through a via;
the semiconductor laser is electrically connected to a center of the PCB board, and a lower end of a housing of the semiconductor laser is connected to the first circular windowed copper area through a thermally conductive silicone grease,
the ring-shaped semiconductor refrigerating sheet is provided with a through hole at a center thereof, a refrigerating surface of the ring-shaped semiconductor refrigerating sheet is connected to the first circular windowed copper area through the thermally conductive silicone grease, the semiconductor laser is sleeved at a center of the through hole, and a heating surface of the ring-shaped semiconductor refrigerating sheet is connected to the heat dissipation plate through the thermally conductive silicone grease;
the heat dissipation plate is provided with a laser output hole, a center line of the through hole coincides with a center line of the laser output hole, and light emitted by the semiconductor laser coincides with the center line of the laser output hole;
the PCB board is fixedly installed on the fixed plate, and the second circular copper area is in contact with the fixed plate; and
the thermal sensor is provided on the first circular windowed copper area to detect a temperature of the first circular windowed copper area.

2. The optical interference light source device according to claim 1, wherein the heat dissipation plate, the PCB board, and the fixed plate are each provided with a plurality of mounting holes, and the laser output hole is provided at a center position of a polygon defined by the plurality of the mounting holes; and each of the plurality of mounting holes is provided with a connecting member to fixedly connect the heat dissipation plate, the PCB board and the fixed plate together.

3. The optical interference light source device according to claim 1, wherein the heat dissipation plate is made of aluminum.

4. The optical interference light source device according to claim 1, wherein the thermal sensor is a Negative Temperature Coefficient (NTC) thermistor.

5. A laser wavenumber scanning interferometry system, comprising:
an optical interference light source device of a current-temperature controlled semiconductor laser, comprising a heat dissipation plate, a ring-shaped semiconductor refrigerating sheet, a semiconductor laser, a PCB board, a thermal sensor and a fixed plate;
a beam splitter configured to divide relevant coherent light into two parts;
a measured lens;
an optical wedge;
a CCD camera configured to capture an interference image;
a computer configured to process image information;
a controller configured to adjust an operating temperature and an operating current of the semiconductor laser; and
a bilateral telecentric lens for precision inspection,
wherein a first circular windowed copper area and a second circular copper area are provided at centers of two surfaces of the PCB board, respectively, and the first circular windowed copper area is in contact with the second circular copper area through a via;
the semiconductor laser is electrically connected to a center of the PCB board, and a lower end of a housing of the semiconductor laser is connected to the first circular windowed copper area through a thermally conductive silicone grease,
the ring-shaped semiconductor refrigerating sheet is provided with a through hole at a center thereof, a refrigerating surface of the ring-shaped semiconductor refrigerating sheet is connected to the first circular windowed copper area through the thermally conductive silicone grease, the semiconductor laser is sleeved at a center of the through hole, and a heating surface of the ring-shaped semiconductor refrigerating sheet is connected to the heat dissipation plate through the thermally conductive silicone grease;
the heat dissipation plate is provided with a laser output hole, a center line of the through hole coincides with a center line of the laser output hole, and light emitted by the semiconductor laser coincides with the center line of the laser output hole;
the PCB board is fixedly installed on the fixed plate, and the second circular copper area is in contact with the fixed plate;
the thermal sensor is provided on the first circular windowed copper area to detect a temperature of the first circular windowed copper area;
wherein the optical interference light source device, the bilateral telecentric lens, the optical wedge, and the measured lens are sequentially arranged in a counter-clockwise direction, and the beam splitter is located at a center position;
the coherent light is emitted from the optical interference light source device, and reaches the optical wedge through the beam splitter, to form a first incident light path;
the coherent light is reflected at the optical wedge and reaches the bilateral telecentric lens through the beam splitter, to form a first reflected light path;
the coherent light is emitted from the optical interference light source device, and reaches the measured lens through the beam splitter, to form a second incident light path;
the coherent light is reflected at the measured lens, and reaches the bilateral telecentric lens through the beam splitter, to form a second reflected light path;
the first reflected light path and the second reflected light path form an interference image after passing through the bilateral telecentric lens; and
the CCD camera is further configured to sample the interference image to obtain an interference signal and send the interference signal to the computer.

6. The laser wavenumber scanning interferometry system according to claim 5, wherein the heat dissipation plate, the PCB board, and the fixed plate are each provided with a plurality of mounting holes, and the laser output hole is provided at a center position of a polygon defined by the plurality of the mounting holes; and each of the plurality of mounting holes is provided with a connecting member to fixedly connect the heat dissipation plate, the PCB board and the fixed plate together.

7. The laser wavenumber scanning interferometry system according to claim 5, wherein the heat dissipation plate is made of aluminum.

8. The laser wavenumber scanning interferometry system according to claim 5, wherein the thermal sensor is a Negative Temperature Coefficient (NTC) thermistor.

9. The laser wavenumber scanning interferometry system according to claim 5, wherein the interference signal sampled and obtained by the CCD camera is a discrete interference signal, and the computer is configured to perform a Fourier transform on the interference signal to obtain an amplitude-frequency characteristic and a phase-frequency characteristic, obtain an interference phase and an interference frequency at a peak, then demodulate the interference phase and the interference frequency to obtain depth contour information of a measured surface, and then obtain a 3D model map of a measured object by fitting.

10. The laser wavenumber scanning interferometry system according to claim 6, wherein the interference signal sampled and obtained by the CCD camera is a discrete interference signal, and the computer is configured to perform a Fourier transform on the interference signal to obtain an amplitude-frequency characteristic and a phase-frequency characteristic, obtain an interference phase and an interference frequency at a peak, then demodulate the interference phase and the interference frequency to obtain depth contour information of a measured surface, and then obtain a 3D model map of a measured object by fitting.

11. The laser wavenumber scanning interferometry system according to claim 7, wherein the interference signal sampled and obtained by the CCD camera is a discrete interference signal, and the computer is configured to perform a Fourier transform on the interference signal to obtain an amplitude-frequency characteristic and a phase-frequency characteristic, obtain an interference phase and an interference frequency at a peak, then demodulate the interference phase and the interference frequency to obtain depth contour information of a measured surface, and then obtain a 3D model map of a measured object by fitting.

12. The laser wavenumber scanning interferometry system according to claim 8, wherein the interference signal sampled and obtained by the CCD camera is a discrete interference signal, and the computer is configured to perform a Fourier transform on the interference signal to obtain an amplitude-frequency characteristic and a phase-frequency characteristic, obtain an interference phase and an interference frequency at a peak, then demodulate the interference phase and the interference frequency to obtain depth contour information of a measured surface, and then obtain a 3D model map of a measured object by fitting.

* * * * *